(12) United States Patent
Soeno et al.

(10) Patent No.: US 7,952,143 B2
(45) Date of Patent: May 31, 2011

(54) SEMICONDUCTOR DEVICE HAVING IGBT AND DIODE

(75) Inventors: Akitaka Soeno, Toyota (JP); Yukihiro Hisanaga, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 169 days.

(21) Appl. No.: 12/436,888

(22) Filed: May 7, 2009

(65) Prior Publication Data
US 2009/0278166 A1 Nov. 12, 2009

(30) Foreign Application Priority Data
May 9, 2008 (JP) .................... 2008-123618

(51) Int. Cl.
*H01L 29/66* (2006.01)
(52) U.S. Cl. . 257/341; 257/133; 257/146; 257/E29.027; 438/135
(58) Field of Classification Search .................. 257/133, 257/341
See application file for complete search history.

(56) References Cited

U.S. PATENT DOCUMENTS
2007/0108468 A1* 5/2007 Takahashi ..................... 257/133

FOREIGN PATENT DOCUMENTS
| JP | 02-126682 A | 5/1990 |
| JP | 2002-368214 A | 12/2002 |
| JP | 2005-317751 A | 11/2005 |
| JP | 2006-352101 A | 1/2006 |
| JP | 2007-012786 A | 1/2007 |
| JP | 2007-103770 A | 4/2007 |
| JP | 2007-134625 A | 5/2007 |
| JP | 2007-214541 A | 8/2007 |
| JP | 2008-004866 A | 1/2008 |

* cited by examiner

*Primary Examiner* — Ajay K Arora
(74) *Attorney, Agent, or Firm* — Kenyon & Kenyon LLP (57) ABSTRACT

A semiconductor device in which both an IGBT element region and a diode element region exist in the same semiconductor substrate includes a low lifetime region, which is formed in at least a part of a drift layer within the diode element region and shortens the lifetime of holes. A mean value of the lifetime of holes in the drift layer that includes the low lifetime region is shorter within the IGBT element region than within the diode element region.

8 Claims, 8 Drawing Sheets

SEMICONDUCTOR DEVICE HAVING IGBT AND DIODE

INCORPORATION BY REFERENCE

The disclosure of Japanese Patent Application No. 2008-123618 filed on May 9, 2008 including the specification, drawings and abstract is incorporated herein by reference in its entirety.

BACKGROUND OF THE INVENTION

1. Field of the Invention

The present invention relates to a reverse conducting semiconductor device in which both an insulated gate bipolar transistor (IGBT) element region and a diode element region are provided in the same semiconductor substrate.

2. Description of the Related Art

Reverse conducting semiconductor devices exist in which both a region where an insulated gate bipolar transistor (IGBT) is formed (IGBT element region) and a region where an free wheel diode (FWD) is formed (diode element region) exist in the same semiconductor substrate. Because two kinds of elements exist in reverse conducting semiconductor devices, it is difficult to form an optimal structure for both of the elements in the same semiconductor substrate. Japanese Patent Application Publication No. 2005-317751 suggests that the recovery loss when the diode is shifted from a conductive state to a non-conductive state is greater in a reverse conducting semiconductor device than in IGBT and the diode formed in separate substrates. To overcome this problem, a semiconductor device 100 (see FIG. 14 attached to the present application) described in JP-A-2005-317751 includes a low lifetime layer 161. Below, the structure and operation of the semiconductor device 100 will be described.

Figure 14:
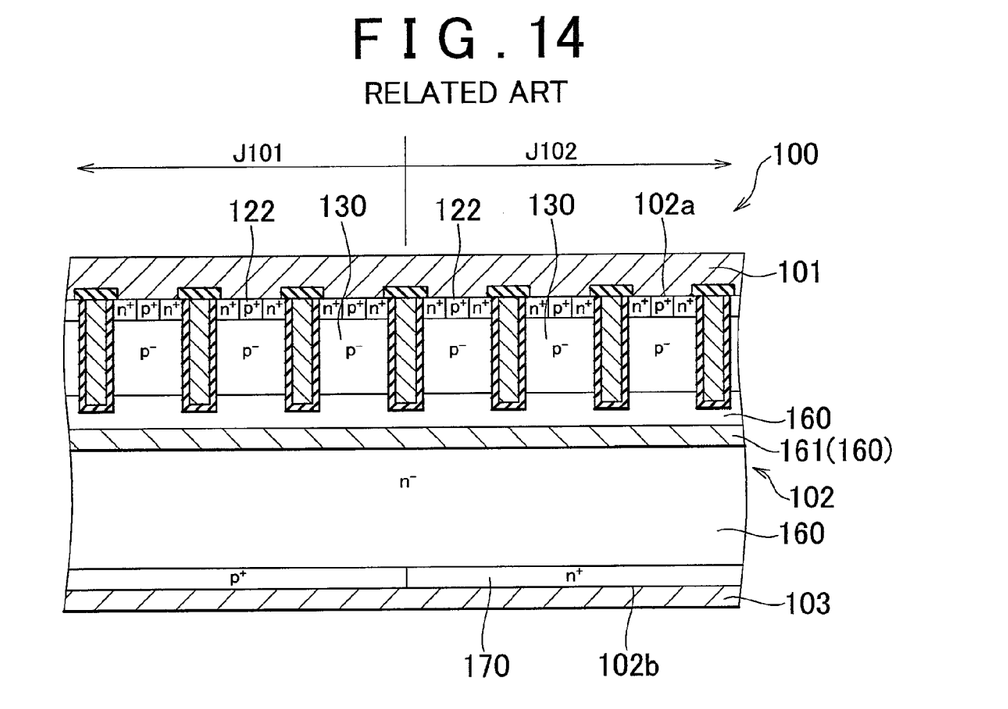
FIG. 14 is a sectional view of a main portion reverse conducting semiconductor device according to the related art.

The semiconductor device 100 includes an n$^-$-type layer 160 that extends across both an IGBT element region J101 and a diode element region J102. The n$^-$-type layer 160 serves as a drift layer in the IGBT element region J101. In addition, the n$^-$-type layer 160 serves as an n$^-$-type cathode layer (high-resistance layer) in the diode element region J102. In this specification, the drift layer and the high-resistance layer will be generically referred to as drift layer. Hereinafter, the n$^-$-type layer 160 will be referred to as drift layer 160. The low lifetime layer 161 is formed at the intermediate depth of the n$^-$-type layer 160. The low lifetime layer 161 is formed by bombarding a lifetime killer (such as helium) from the front surface 102a of a semiconductor substrate 102. The low lifetime layer 161 extends across the drift layer 160 in the IGBT element region J101 and the drift layer 160 in the diode element region J102. In the low lifetime layer 161, the lifetime of minority carriers (holes) is short.

When a voltage higher than that applied to a back-surface electrode 103 is applied to a front-surface electrode 101 of the semiconductor device 100, holes flow out from a high-concentration p-type region 122 that is formed to face the front surface 102a of the semiconductor substrate 102. The holes are injected into the drift layer 160 via a low-concentration p-type layer 130. Also, electrons flow out from a cathode region 170 that is formed to face a back surface 102b of the diode element region J102, and are injected into the drift layer 160. Electric current flows between the anode and the cathode (between the high-concentration p-type region 122 and the cathode region 170), so that the diode element region J102 is shifted into a conductive state. When the voltage to the front-surface electrode 101 falls below the voltage to the back-surface electrode 103, holes are no longer injected from the high-concentration p-type region 122 into the drift layer 160. The diode element region J102 is thus shifted into a non-conductive state.

As the diode element region J102 is shifted from a conductive state to a non-conductive state, a phenomenon occurs in which the holes injected into the drift layer 160 return to the low-concentration p-type layer 130. As a result, recovery current flows in the diode element region J102 in a direction opposite from that when conductive. When the recovery current flows, loss occurs, and the diode element region J102 generates heat. The semiconductor device 100 includes the low lifetime layer 161. Some of the holes that return to the low-concentration p-type layer 130 at the time of a recovery operation are lost in the low lifetime region 161. The provision of the low lifetime layer 161 makes it possible to reduce the recovery current in the diode element region J102, thus enabling reduction in recovery loss in the diode element region J102.

When the reverse conducting semiconductor device described in JP-A-2005-317751 is used, it is possible to reduce recovery loss in the diode element region J102. However, in the IGBT element region J101, this is likely to adversely affect the conductivity modulation phenomenon when the low lifetime layer 161 is in an ON state, thereby increasing the voltage in the IGBT element region J101.

SUMMARY OF THE INVENTION

The present invention provides a reverse conducting semiconductor device in which both an IGBT element region and a diode element region are provided in the same semiconductor substrate, and that reduces the recovery loss in the diode element region without increasing the ON-state voltage in the IGBT element region.

An aspect of the present invention relates to a reverse conducting semiconductor device in which both an IGBT element region and a diode element region are formed on the same semiconductor substrate. This semiconductor device includes: a p-type collector layer, an n-type drift layer, and a p-type body layer that are laminated in order in the IGBT element region; a trench gate electrode that extends through the body layer from a front surface of the body layer to project into the drift layer; an insulating film that surrounds the trench gate electrode; an n-type emitter region that is in contact with the insulating film and is formed in an area facing the front surface of the body layer, in which the emitter region is separated from the drift layer by the body layer; an n-type cathode layer, the drift layer, and a p-type anode layer that are laminated in order in the diode element region; an anode region that is formed in an area that faces a front surface of the anode layer, and contains a p-type impurity at higher concentration than in the anode layer, in which the anode region is separated from the drift layer by the anode layer; and a low lifetime region that is formed in at least a part of the drift layer within the diode element region, and shortens a lifetime of a hole. A mean value of a lifetime of a hole in the drift layer that includes the low lifetime region is shorter within the diode element region than within the IGBT element region.

According to the above-mentioned semiconductor device, the low lifetime region is provided in at least a part of the drift layer within the diode element region. Thus, at the time of a recovery operation in which the diode element region is shifted from a conductive state to a non-conductive state, some of the holes that return to the anode layer are lost in the low lifetime region. This makes it possible to reduce recovery current in the diode element region, thus enabling reduction in recovery loss in the diode element region. Also, in the above-mentioned semiconductor device, the mean value of the lifetime of a hole in the drift layer that includes the low lifetime region is shorter within the IGBT element region than within the diode element region. In the IGBT element region, the holes that exist in the drift layer when the IGBT element region is in the ON state are not easily lost, and conductivity modulation is actively performed. Thus, the ON-state voltage in the IGBT element region does not increase. According to the above-mentioned semiconductor device, recovery loss in the diode element region can be reduced without increasing the ON-state voltage in the IGBT element region.

According to the present invention, recovery loss in the diode element region can be reduced without increasing the ON-state voltage in the IGBT element region.

BRIEF DESCRIPTION OF THE DRAWING

The features, advantages, and technical and industrial significance of this invention will be described in the following detailed description of example embodiments of the invention with reference to the accompanying drawings, in which like numerals denote like elements, and wherein.

DETAILED DESCRIPTION OF EMBODIMENTS

The main features of a semiconductor device according to an embodiment of the present invention, which will be described in the following, are listed below. A low lifetime region of the semiconductor device is formed at least within a drift layer near the boundary between an anode layer and the drift layer. After a resist is formed on an area of the front surface of a semiconductor layer that is to become an IGBT element region of the semiconductor device, a non-conductive impurity is implanted from the front surface side. The acceleration voltage at the time when the non-conductive impurity is implanted from the front surface side is set in such a way that the peak of the concentration of the non-conductive impurity to be implanted occurs within the drift layer near the boundary between the anode layer and the drift layer.

Figure 1:
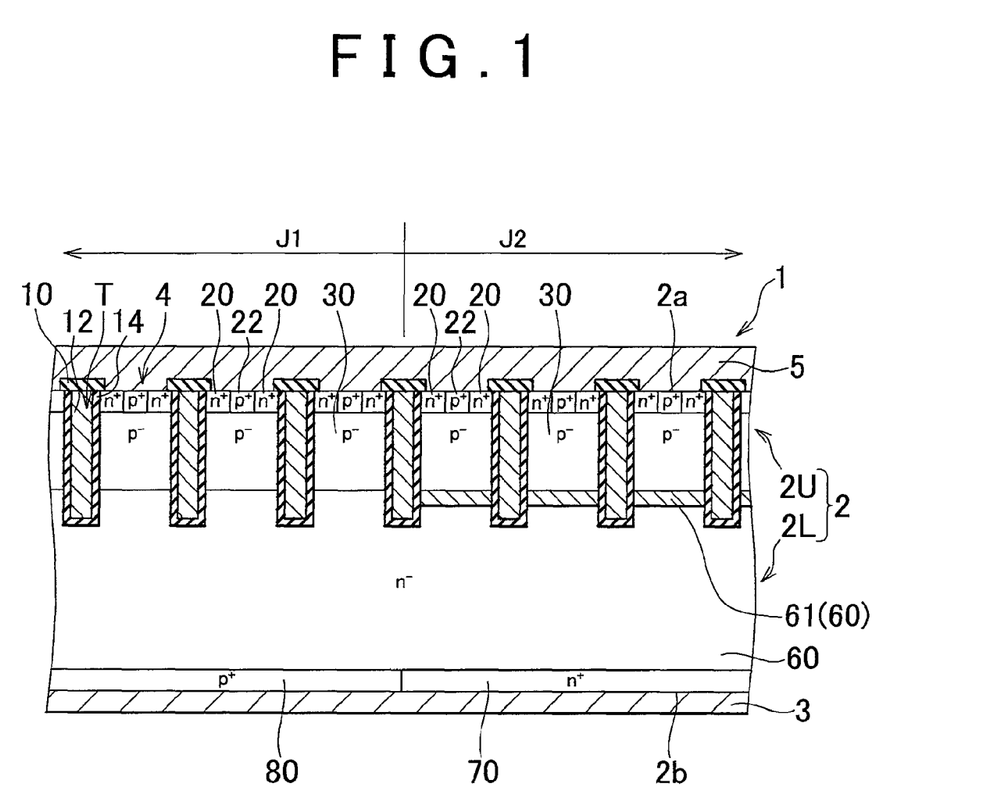
FIG. 1 is a sectional view of a main portion of a reverse conducting semiconductor device.

FIG. 1 is a sectional view of the main portion of a reverse conducting semiconductor device 1 in which an IGBT element region J1 and a diode element region J2 coexist in a semiconductor layer 2. The semiconductor device 1 includes the semiconductor layer 2 made of silicon, a back-surface electrode 3 formed on a back surface 2b of the semiconductor layer 2, and a front-surface electrode 5 formed on a front surface 2a of the semiconductor layer 2.

The back-surface electrode 3 extends continuously on the back surface of the IGBT element region J1 and on the back surface of the diode element region J2. The semiconductor layer 2 includes a shallow portion 2U and a deep portion 2L. The deep portion 2L includes a $p^+$-type collector region 80 and an $n^+$-type cathode region 70. The collector region 80 is formed in an area of the back surface 2b of the semiconductor layer 2 that is coextensive with the IGBT element region J1. The cathode region 70 is formed in an area of the back surface 2b that is coextensive with the diode element region J2. The back-surface electrode 3 described above is connected to the collector region 80 and the cathode region 70. Also, the deep portion 2L includes an $n^-$-type drift layer 60 that is formed on top of the collector region 80 and the cathode region 70.

A plurality of trenches T are formed in the shallow portion 2U of the semiconductor layer 2. Each trench T extends with its longitudinal direction aligned along a depth direction shown in FIG. 1. Also, each trench T extends from the front surface 2a of the semiconductor layer 2 in a depth direction of the semiconductor layer 2. A trench gate electrode 12 is received within the trench T while being surrounded by an insulating film 14. The shallow portion 2U is partitioned into a plurality of partitioned regions 4 by pairs of successive trenches T.

The same semiconductor structure is formed in each partitioned region 4. The partitioned region 4 includes a low-concentration p-type layer 30, an $n^+$-type trench-adjoining region 20, and a high-concentration p-type region 22. The low-concentration p-type layer 30 is formed across successive trenches T. The $n^+$-type trench-adjoining region 20 is exposed on a part of the front surface 2a of the semiconductor layer 2. The trench-adjoining region 20 contacts the trench T. Therefore, the trench-adjoining region 20 faces the trench gate electrode 12 via the insulating film 14. The high-concentration p-type region 22 is exposed on the other part of the front surface 2a of the semiconductor layer 2. The high-concentration p-type region 22 is placed between successive trench-adjoining regions 20. In the partitioned region 4, the trench-adjoining region 20 and the high-concentration p-type region 22 are separated from the $n^-$-type drift layer 60 by the low-concentration p-type layer 30. In this embodiment, the IGBT element region J1 and the diode element region J2 are common both share the same n-type drift layer 60, so both the drift layers 60 will be generically referred to as drift layers.

In the IGBT element region J1, the low-concentration p-type layer 30 serves as a body region. In the IGBT element region J1, the trench-adjoining region 20 serves as an emitter region. In the IGBT element region J1, the high-concentration p-type region 22 serves as a body contact region. In the diode element region J2, the low-concentration p-type layer 30 serves as a low-concentration anode layer. In the diode element region J2, the high-concentration p-type region 22 serves as an anode region.

Further, the diode element region J2 includes a low lifetime region 61 that is formed in at least a part of the region of the drift layer 60. In the semiconductor device 1 shown in FIG. 1, the low lifetime region 61 is formed within the drift layer 60 near the boundary between the drift layer 60 and the low-concentration p-type layer 30. The low lifetime region 61 is formed in an area shallower than the deepest portion of the trench T. The low lifetime region 61 extends across successive trenches T.

In comparison to the other region of the drift layer 60 excluding the low lifetime region, the concentration of carbon C (an example of non-conductive impurities) and oxygen O (an example of non-conductive impurities) is high in the low lifetime region 61. Carbon C and oxygen O are coupled in between lattices of silicon that form the semiconductor layer 2. In regions with a high content of couplings of carbon C and oxygen O, the lifetime of holes is short. In the semiconductor device 1, the lifetime of holes in the low lifetime region 61 is shorter than the lifetime of holes in the drift layer 60 within the IGBT element region J1 at the same depth as the low lifetime region 61. The drift layer 60 is common to the IGBT element region J1 and the diode element region J2, while the low lifetime region 61 is not formed in the drift layer 60 in the IGBT element region J1. Therefore, the average lifetime of holes in the drift layer 60 that includes the low lifetime region 61 is shorter in the diode element region J2 than in the IGBT element region J1.

The front-surface electrode 5 that is formed on the front surface 2a of the semiconductor layer 2 extends continuously on the front surface of the IGBT element region J1 and on the front surface of the diode element region J2. In the IGBT element region J1, the front-surface electrode 5 is in electrical conduction with the trench-adjoining region (emitter region) 20 and the high-concentration p-type region (body contact region) 22. Also, in the diode element region J2, the front-surface electrode 5 is in electrical conduction with the trench-adjoining region 20 and the high-concentration p-type region (anode region) 22. An insulating film 10 is formed between the trench gate electrode 12 and the front-surface electrode 5, and the two electrodes are not connected to each other. The trench gate electrode 12 is connected to gate wiring (not shown) in a region where the front-surface electrode 5 is not formed.

With the above configuration, the semiconductor device 1 that serves as a reverse conducting IGBT is formed. The semiconductor device 1 serves as a circuit in which a diode that is formed by the diode element region J2 is connected in anti-parallel between a pair of main electrodes (between a collector and an emitter) of an IGBT that is formed by the IGBT element region J1.

Figure 2:
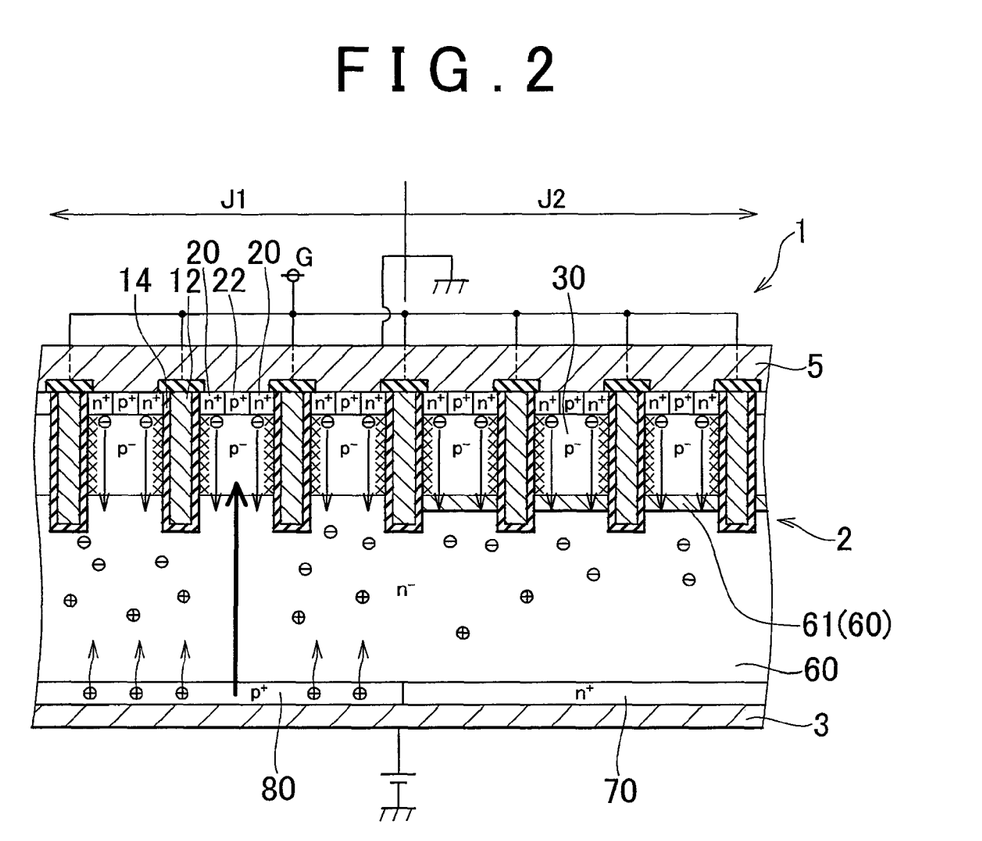
FIG. 2 is a view illustrating the ON state of an IGBT element region of the semiconductor device shown in FIG. 1.

Referring to FIG. 2, the operation of the semiconductor device 1 when a higher voltage is applied to the back-surface electrode 3 than to the front-surface electrode 5 of the semiconductor device 1 and when a gate voltage G (gate-ON voltage) that is equal to or higher than a threshold value is applied to the trench gate electrode 12 will be described. In this case, in both the IGBT element region J1 and the diode element region J2, the low-concentration p-type layer 30 that is on the opposite side of the insulating film 14 from the trench gate electrode 12 is inverted to n-type to form n-type channels. In FIG. 2, the n-type channels are illustrated as cross marks. Thus, electrons flowing out from the trench-adjoining region 20 are injected into the drift layer 60 via the n-type channels. In FIG. 2, the electrons are illustrated as minus marks. As a result, holes move from the collector region 80 of the IGBT element region J1 toward the drift layer 60. In FIG. 2, the holes are illustrated as plus marks. A conductivity modulation phenomenon occurs as the electrons and holes are injected into the drift layer 60, and the IGBT element region J1 is shifted into an ON state with a low ON-state voltage. As indicated by a thick arrow in FIG. 2, current flows from the back-surface electrode 3 to the front-surface electrode 5.

Figure 3:
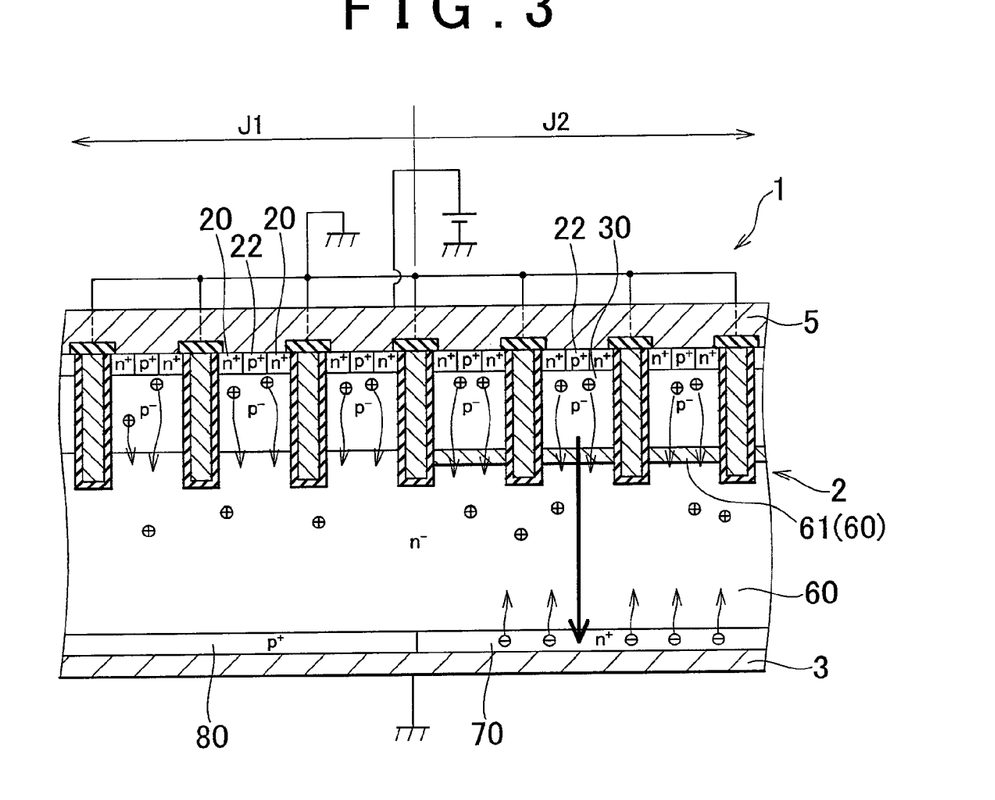
FIG. 3 is a view illustrating the conductive state of a diode element region of the semiconductor device shown in FIG. 1.

Referring to FIG. 3, the operation of the semiconductor device 1 when a higher forward voltage is applied to the front-surface electrode 5 than to the back-surface electrode 3 of the semiconductor device 1 will be described. A gate-ON voltage is not applied to the trench gate electrode 12. In this case, in both the diode element region J2 and the IGBT element region J1, holes flow out from the high-concentration p-type region 22 to the drift layer 60 via the low-concentration p-type layer 30. On the other hand, electrons move from the $n^+$-type cathode region 70 toward the drift layer 60. The diode element region J2 is thus shifted into a conductive state. As indicated by a thick arrow in FIG. 3, a current flows from the front-surface electrode 5 to the back-surface electrode 3.

Thereafter, when the voltage to the front-surface electrode 5 is set lower than the voltage to the back-surface electrode 3, holes no longer flow out from the high-concentration p-type region 22 to the drift layer 60. Thus, the diode element region J2 is shifted into a non-conductive state. As the diode element region J2 is shifted from a conductive state to a non-conductive state, the holes injected into the drift layer 60 try to return to the low-concentration p-type layer 30. Due to this phenomenon, in the diode element region J2, a recovery current tries to flow in a direction that is opposite to the direction in the conductive state (direction opposite to that indicated by the thick arrow in FIG. 3). The semiconductor device 1 according to this embodiment includes the low lifetime region 61 in the drift layer 60 within the diode element region J2. Thus, some of the holes that return to the low-concentration p-type layer 30 are lost in the low lifetime region 61 at the time of a recovery operation. This reduces the recovery current in the diode element region J2, thus enabling a reduction in recovery loss in the diode element region J2.

In the semiconductor device 1 according to this embodiment, the low lifetime region 61 is not formed in the IGBT element region J1. In the IGBT element region J1, the holes present in the drift layer 60 when the IGBT element region J1 is in the ON state are not easily lost, and conductivity modulation is actively performed. The ON-state voltage in the IGBT element region J1 is low as in a case in which the low lifetime region 61 is not formed. According to the semiconductor device 1 of this embodiment, recovery loss is reduced without increasing the ON-state voltage in the IGBT element region J1.

Figure 4:
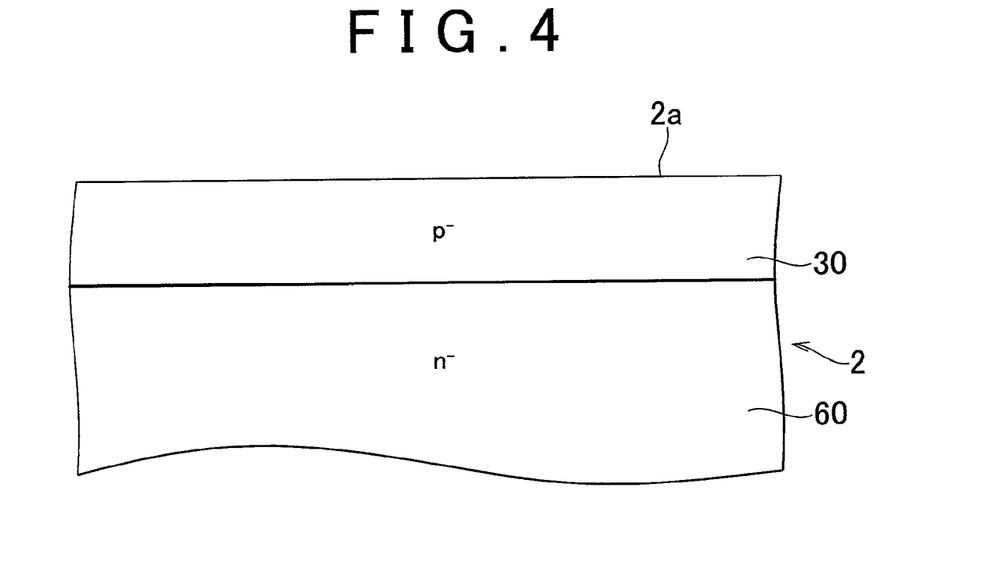
FIG. 4 is a view illustrating a manufacturing process of the semiconductor device shown in FIG. 1.

Next, a method of manufacturing the semiconductor device 1 will be described with reference to FIGS. 4 to 13. As shown in FIG. 4, first, the n-type semiconductor layer 2 is prepared. Boron, a p-type impurity, is implanted from the front surface 2a (implantation condition: the amount of implantation per unit area is set to about $3 \times 10^{13}$ cm$^{-2}$). Thereafter, with heat treatment for 40 minutes at 1,150° C., the implanted boron is activated, and the low-concentration p-type layer 30 shown in FIG. 4 is formed. The $n^-$-type semiconductor layer 2, that is located below the low-concentration p-type layer 30 serves as the drift layer 60.

Figure 5:
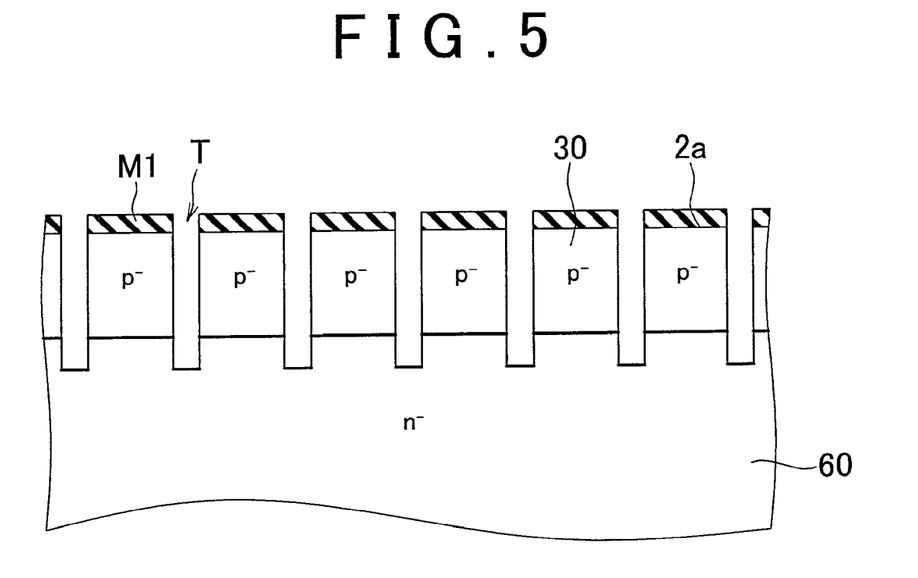
FIG. 5 is a view illustrating a manufacturing process of the semiconductor device shown in FIG. 1.

Next, as shown in FIG. 5, an oxide film having a thickness of 300 nm is formed on the front surface 2a via chemical vapor deposition (CVD). An opening is formed in an area where the trench T is to be formed to make a mask M1. Etching is applied from the portion of the front surface 2a, which is exposed at the opening of the mask M1, to the low-concentration p-type layer 30 and a part of the drift layer 60 (about 6 μm from the front surface 2a). This forms the plurality of trenches T that extends through the low-concentration p-type layer 30 from the front surface 2a and projects into the drift layer 60. Then, the mask M1 is removed by wet etching.

Figure 6:
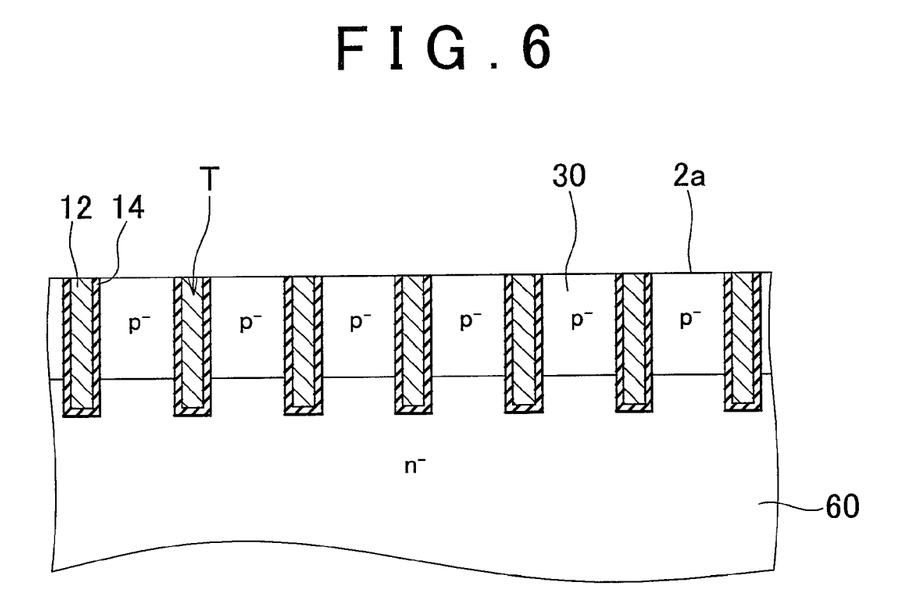
FIG. 6 is a view illustrating a manufacturing process of the semiconductor device shown in FIG. 1.

Next, as shown in FIG. 6, heat treatment is applied to the semiconductor layer 2 for 50 minutes at 1,100° C. for thermal oxidation of the inner surface of trench T, thereby forming the insulating film 14. Then, the trench T is filled with a conductive material such as polysilicon to form the trench gate electrode 12. The insulating film 14 that is formed on the inner surface of the trench T serves as a gate oxide film.

Figure 7:
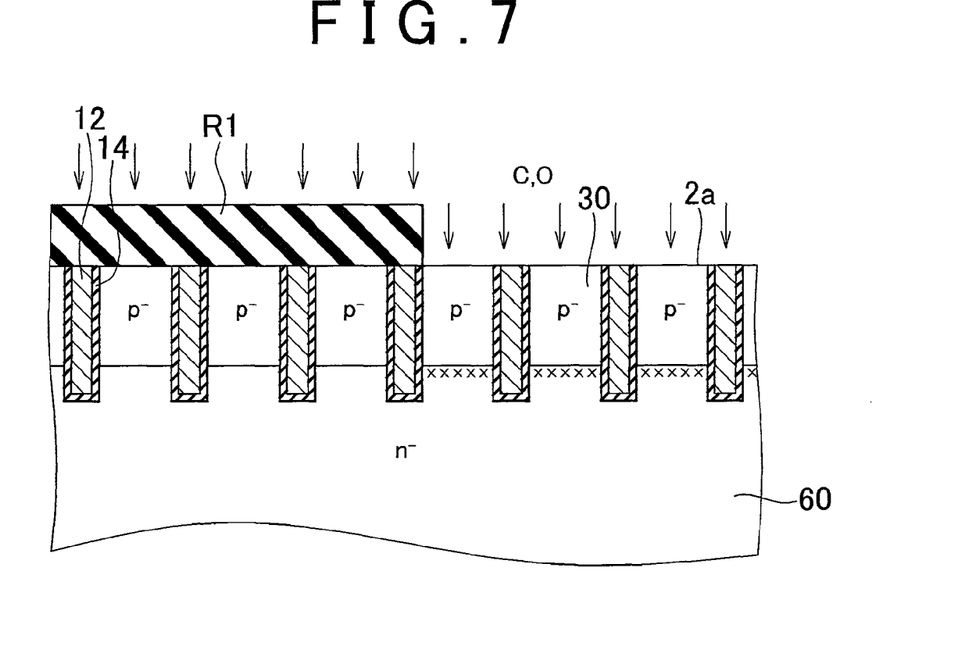
FIG. 7 is a view illustrating a manufacturing process of the semiconductor device shown in FIG. 1.
Figure 8:
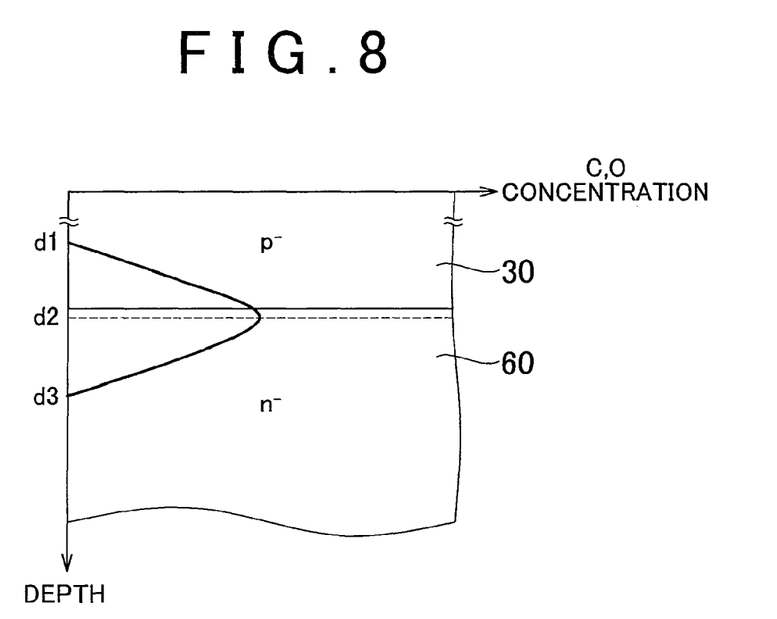
FIG. 8 is a view illustrating a manufacturing process of the semiconductor device shown in FIG. 1.
Figure 9:
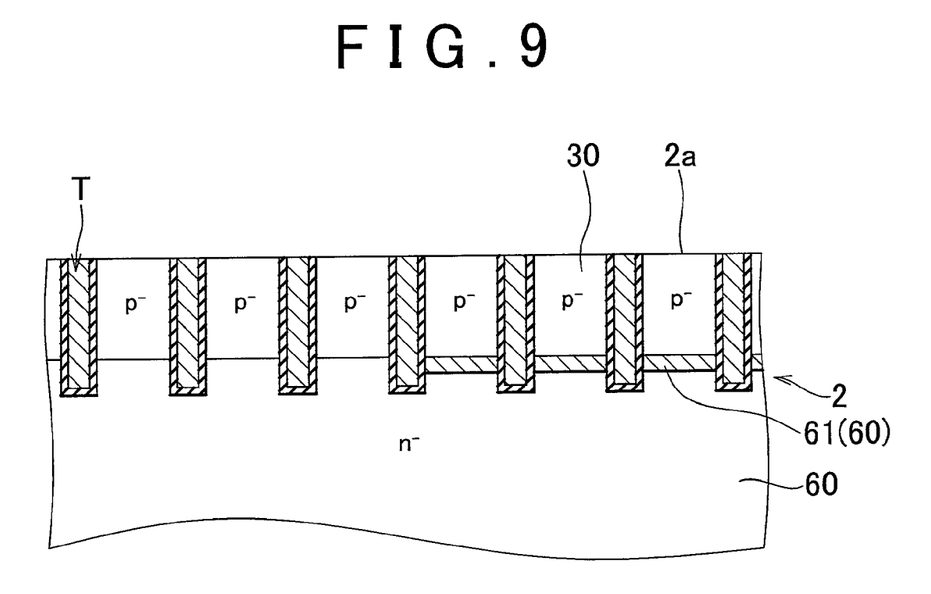
FIG. 9 is a view illustrating a manufacturing process of the semiconductor device shown in FIG. 1.

Next, as shown in FIG. 7, a resist R1 of about 4 μm in thickness is formed on an area of the front surface 2a that is to become the IGBT element region J1. Carbon C and oxygen O as non-conductive impurities are implanted from the front surface 2a. In this regard, the relationship between the depth from the front surface 2a of the semiconductor layer 2, and the concentration of implanted carbon C and oxygen O is shown in FIG. 8. In FIG. 8, carbon C and oxygen O are implanted from depth d1 to depth d3. As shown in FIG. 8, the implantation acceleration voltage is set in such a way that the concentration of carbon C and oxygen O to be implanted reaches a maximum within the drift layer 60 (at depth d2 in FIG. 8) near the boundary between the drift layer 60 and the low-concentration p-type layer 30 in the area that is to become the diode element region J2. Also, the implantation acceleration voltage is set in such a way that the depth d3 is shallower than the depth of the deepest portion of the trench T. For example, when carbon C is implanted, the acceleration voltage of a high-voltage ion implanter is set to about 3 MeV, and the amount of implantation per unit area is set to about $1.5 \times 10^{12}$ cm$^{-2}$. Also, when oxygen O is implanted, the acceleration voltage of the high-voltage ion implanter is set to about 4 MeV, and the amount of implantation per unit area is set to about $3 \times 10^{12}$ cm$^{-2}$. After implanting carbon C and oxygen O, the resist R1 is removed by ashing and oxidation peeling. To repair damage to the semiconductor layer 2 after the implantation, heat treatment is performed at the temperature of 400° C. or higher. As shown in FIG. 9, the low lifetime region 61, which contains a large number of couplings of carbon C and oxygen O, is formed in an area that is to become the diode element region J2.

It should be noted that when impurities are implanted in the diode element region J2, it is preferable that no impurities be implanted in the IGBT element region J1. However, in reality, trace impurities may be implanted beyond the resist R1 (see FIG. 7) and reach a shallow area from the front surface 2a of the IGBT element region J1. This is due to such reasons that in order to implant impurities to a deep position from the front surface 2a of the diode element region J2, the acceleration voltage at the time of implantation must be set high, and that it is difficult to form a thick resist R1 in thickness of over 4 μm on the front surface 2a. However, a shallow area from the front surface 2a, the trench-adjoining region 20 with a high n-type impurity concentration and the high-concentration p-type region 22 with a high p-type impurity concentration are to be formed in subsequent steps. Thus, as far as carbon C and oxygen O are implanted in a shallow area from the front surface 2, in the IGBT element region J1, it is unlikely to adversely affect the conductivity modulation phenomenon that occurs in the drift layer 60 when the IGBT element region J1 is in the ON state. Thus, a situation in which the ON-state voltage in the IGBT element region J1 increases is unlikely to occur.

Figure 10:
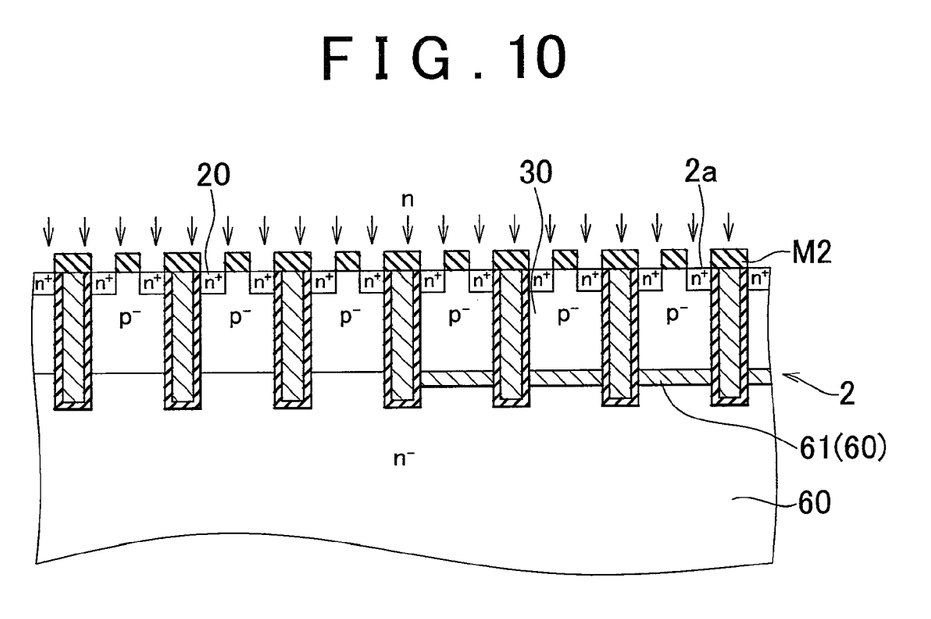
FIG. 10 is a view illustrating a manufacturing process of the semiconductor device shown in FIG. 1.
Figure 11:
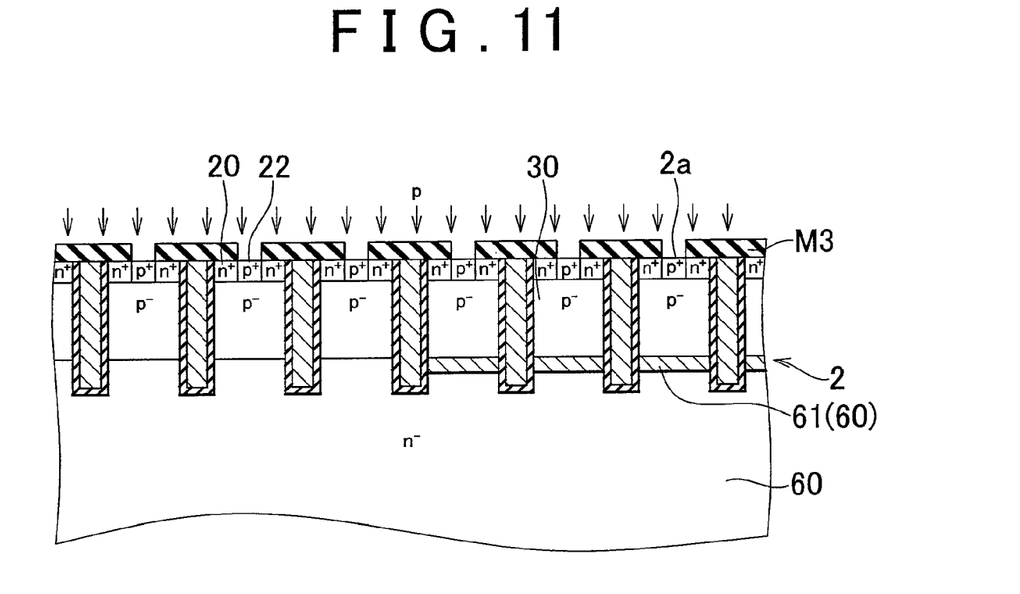
FIG. 11 is a view illustrating a manufacturing process of the semiconductor device shown in FIG. 1.

Next, as shown in FIG. 10, a mask M2 is formed on the front surface 2a. The mask M2 has an opening that is formed in an area where the trench-adjoining region 20 is to be formed. Phosphorus, an n-type impurity, is implanted into the semiconductor layer 2 from the front surface 2a (implantation conditions: the amount of implantation per unit area is set to about $4 \times 10^{14}$ cm$^{-2}$, and the acceleration voltage is about 60 kV). Then, heat treatment is applied to form the n$^+$-type trench-adjoining region 20. The mask M2 is removed from the front surface 2a by ashing and oxidation peeling. Next, as shown in FIG. 11, a mask M3 is formed on the front surface 2a. The mask M3 has an opening that is formed in an area where the high-concentration p-type region 22 is to be formed. Boron is implanted into the semiconductor layer 2 from the front surface 2a (implantation conditions: the amount of implantation per unit area is set to about $4 \times 10^{15}$ cm$^{-2}$, and the acceleration voltage is about 50 kV). Then, heat treatment is applied to form the high-concentration p-type region 22. The mask M3 is removed from the front surface 2a by ashing and oxidation peeling. It should be noted that the above-described heat treatment to form the trench-adjoining region 20 may be performed simultaneously at this time. The trench-adjoining region 20 and the high-concentration p-type region 22 are formed on the front surface 2a of the low-concentration p-type region 30 between successive trenches T.

Figure 12:
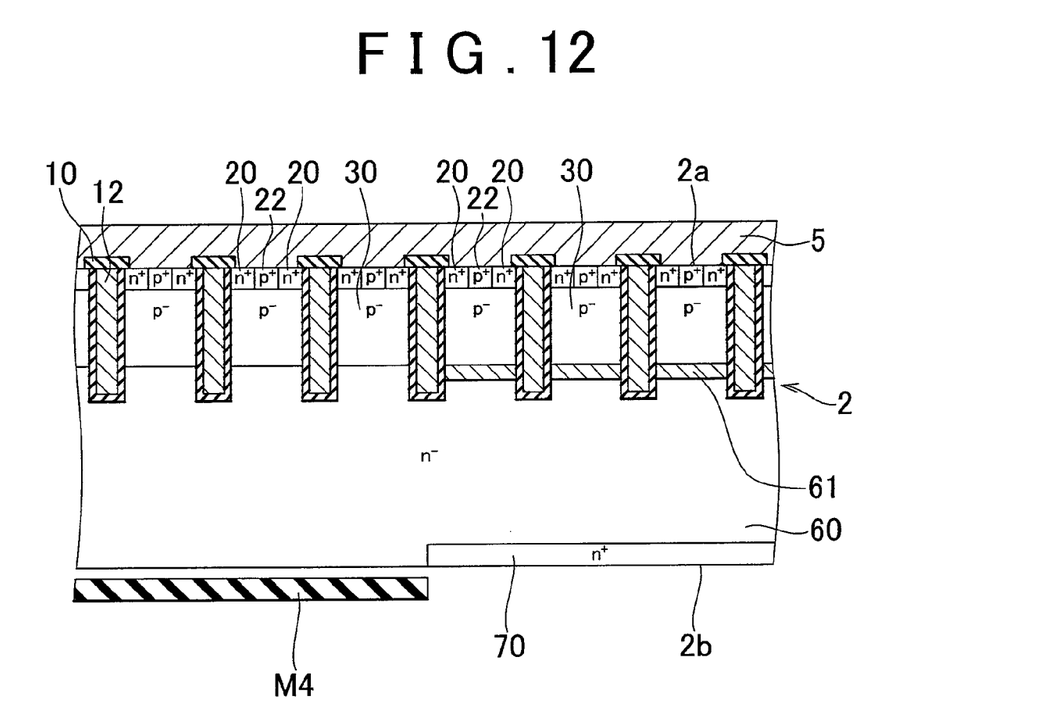
FIG. 12 is a view illustrating a manufacturing process of the semiconductor device shown in FIG. 1.

Next, as shown in FIG. 12, the insulating film 10 is formed by the CVD method in a portion where the trench gate electrode 12 is exposed on the front surface 2a. Barrier metal and aluminum are formed on the front surface 2a by sputtering to form the front-surface electrode 5. The trench gate electrode 12 may be connected to gate wiring (not shown) at any position in the extension direction of the drench gate electrode across the drift layer in FIG. 12. Then, the semiconductor layer 2 is polished from below. Thereafter, a hard mask M4 is placed on an area of the back surface 2b of the semiconductor layer 2 where the IGBT element region J1 is to be formed, and phosphorus is implanted from the back surface 2b (implantation conditions: the amount of implantation per unit area is set to about $1 \times 10^{15}$ cm$^{-2}$, and the acceleration voltage is about 50 kV). Thereafter, laser annealing is applied, forming the n$^+$-type cathode region 70.

Figure 13:
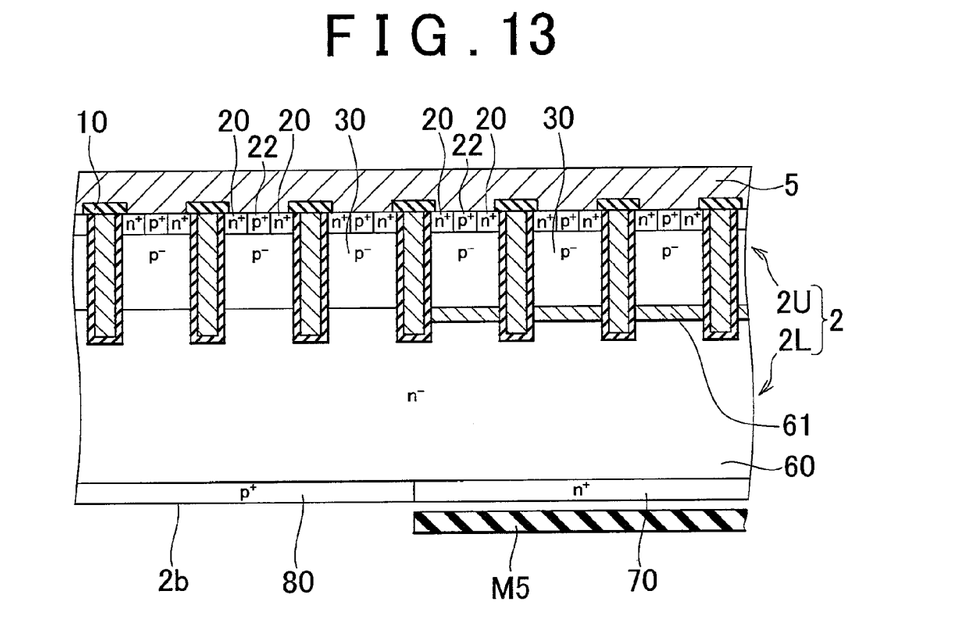
FIG. 13 is a view illustrating a manufacturing process of the semiconductor device shown in FIG. 1.

Next, as shown in FIG. 13, a hard mask M5 is placed in an area where phosphorus is implanted, and boron is implanted from the back surface 2b (implantation conditions: the amount of implantation per unit area is set to about $3 \times 10^{13}$ cm$^{-2}$, and the acceleration voltage is about 50 kV). Thereafter, laser annealing is applied to form the p$^+$-type collector region 80. It should be noted that the collector region 80 and the cathode region 70 may be formed by applying laser annealing simultaneously. Alternatively, heat treatment may be applied within a temperature range that does not greatly affect the shallow portion 2U that has already been formed. Then, as shown in FIG. 1, for example, a laminated film of aluminum, titanium, nickel, and gold is formed on the back surface 2b by sputtering. Thus, the back-surface electrode 3 that connects to both the collector region 80 and the cathode region 70 is formed.

According to the above manufacturing method, the low lifetime region 61 may be formed only in the drift layer 60 of the diode element region J2 without forming the low lifetime region in the drift layer 60 in the IGBT element region J1. In addition, the low lifetime region 61 is formed in an area that is shallower than the deepest portion of the trench T. Thus, implanted carbon C and oxygen O are unlikely to diffuse beyond the trench T during the manufacturing process. In particular, in the portion of the boundary between the IGBT element region J1 and the diode element region J2, carbon C and oxygen O that are implanted into the diode element region J2 are unlikely to diffuse into the adjoining IGBT element region J1. This is particularly advantageous for when the IGBT element region J1 and the diode element region J2 are formed alternately. Also, in the above-described manufacturing method, carbon C and oxygen O are implanted into the semiconductor layer 2 to form the low lifetime region 61. The low lifetime region 61 may be formed at least within the drift layer 60 near the boundary between the drift layer 60 and the low-concentration p-type layer 30. Accordingly, carbon C and oxygen O are implanted deeply in the front surface 2a of the diode element region J2. Among non-conductive impurities that enable lifetime adjustment, carbon C and oxygen O are relatively light. Therefore, carbon C and oxygen O is easily implanted into a deep area.

While this embodiment is directed to the case in which the trench gate electrode 12 is also formed in the diode element region J2, the trench gate electrode 12 in the diode element region J2 may be omitted. Likewise, the trench-adjoining region 20 in the diode element region J2 may be omitted. The IGBT element region J1 and the diode element region J2 may be formed alternately along at least one direction for each partitioned region 4 that is formed in the shallow portion 2U of the semiconductor layer 2. In this case, the collector region 80 and the cathode region 70 are formed in repetition along at least one direction on the back surface 2b. The low lifetime region 61 may extend to a part of the low-concentration p-type region 30 beyond the boundary between the drift layer 60 and the low-concentration p-type region 30 in the diode element region J2. The entire region of the drift layer 60 in the diode element regions J2 may be the low lifetime region 61. In addition, this embodiment is directed to the case in which the low lifetime region 61 is formed across the successive trenches T in the diode element region J2. However, it suffices that the low lifetime region 61 be formed in at least a part of the drift layer 60 in the diode element region J2, and may not be formed across the trenches T. Furthermore, this embodiment is directed to the case in which the low lifetime region 61 is formed by implanting carbon C and oxygen O which are non-conductive impurities originally contained in the semiconductor layer 2. However, the non-conductive impurities that are implanted are not limited to carbon C and oxygen O. For example, the lifetime of holes may also be reduced also by implanting one or more heavy metals, such as gold Au or platinum Pt, or carbon, oxygen, nitrogen, fluorine, argon, silicon, germanium, or the like.

While embodiments of the present invention have been described above in detail, it is to be understood that these embodiments are illustrative only and do not limit the scope of the claims. Also, the technical elements described in this specification or the drawings exhibit technical utility when used alone or in various combinations, and are not limited to the combinations described in the claims as filed. In addition, the technique illustrated in this specification or the drawings can attain multiple objects at the same time, and attainment of one of the objects itself provides technical utility.

What is claimed is:

1. A semiconductor device in which both an IGBT element region and a diode element region are formed on the same semiconductor substrate, the semiconductor device comprising:
    a p-type collector layer, an n-type drift layer, and a p-type body layer that are laminated in order in the IGBT element region;
    a trench gate electrode that extends through the body layer from a front surface of the body layer to project into the drift layer;
    an insulating film that surrounds the trench gate electrode;
    an n-type emitter region that is in contact with the insulating film and is formed in an area that faces the front surface of the body layer, wherein the emitter region is separated from the drift layer by the body layer;
    an n-type cathode layer, the drift layer, and a p-type anode layer that are laminated in order in the diode element region; an anode region that is formed in an area that faces a front surface of the anode layer, and contains a p-type impurity at higher concentration than in the anode layer, wherein the anode region is separated from the drift layer by the anode layer;
    a low lifetime region that is formed in at least a part of the drift layer within the diode element region, and shortens a lifetime of a hole,
    wherein a mean value of a lifetime of a hole in the drift layer that includes the low lifetime region is shorter within the diode element region than within the IGBT element region, and
    wherein a non-conductive impurity is present at a higher concentration in the low lifetime region than in the drift layer excluding the low lifetime region.

2. The semiconductor device according to claim 1, wherein a lifetime of a hole in the IGBT element region at the same depth as the low lifetime region of the diode element region is longer than the lifetime of a hole in the low lifetime region of the diode element region.

3. The semiconductor device according to claim 1, wherein:
    the low lifetime region contains at least two kinds of non-conductive impurities; and
    each kind of non-conductive impurity is present at a higher concentration in the low lifetime region than in the drift layer excluding the low lifetime region.

4. The semiconductor device according to claim 3, wherein the non-conductive impurities are carbon and oxygen.

5. The semiconductor device according to claim 1, wherein the non-conductive impurity is at least one element that is selected from a group consisting of gold, platinum, carbon, oxygen, nitrogen, fluorine, argon, silicon, or germanium.

6. The semiconductor device according to claim 1, wherein the low lifetime region is formed in the drift layer near a boundary between the drift layer and the anode.

7. A semiconductor device in which both an IGBT element region and a diode element region are formed on the same semiconductor substrate, the semiconductor device comprising:
    a p-type collector layer, an n-type drift layer, and a p-type body layer that are laminated in order in the IGBT element region;
    a trench gate electrode that extends through the body layer from a front surface of the body layer to project into the drift layer;
    an insulating film that surrounds the trench gate electrode;
    an n-type emitter region that is in contact with the insulating film and is formed in an area that faces the front surface of the body layer, wherein the emitter region is separated from the drift layer by the body layer;
    an n-type cathode layer, the drift layer, and a p-type anode layer that are laminated in order in the diode element region; an anode region that is formed in an area that faces a front surface of the anode layer, and contains a p-type impurity at higher concentration than in the anode layer, wherein the anode region is separated from the drift layer by the anode layer;
    a low lifetime region that is formed in at least a part of the drift layer within the diode element region, and shortens a lifetime of a hole, wherein a mean value of a lifetime of a hole in the drift layer that includes the low lifetime region is shorter within the diode element region than within the IGBT element region;

a plurality of trench electrodes that are formed in the diode element region, extending from a front surface of the anode layer and projecting into the drift layer; and
an insulating film that surrounds each trench electrode, wherein the low lifetime region is formed in an area of the drift layer that is shallower than the deepest portions of the trench electrodes.

8. The semiconductor device according to claim 7, wherein the low lifetime region extends across the successive trench electrodes.

* * * * *